(12) United States Patent
Kurata et al.

(10) Patent No.: US 8,779,453 B2
(45) Date of Patent: Jul. 15, 2014

(54) LIGHT-EMITTING ELEMENT AND DISPLAY DEVICE USING SAME

(75) Inventors: Keiko Kurata, Hyogo (JP); Seiji Nishiyama, Osaka (JP); Takashi Isobe, Nara (JP)

(73) Assignee: Panasonic Corporation, Osaka (JP)

( * ) Notice: Subject to any disclaimer, the term of this patent is extended or adjusted under 35 U.S.C. 154(b) by 150 days.

(21) Appl. No.: 13/361,006

(22) Filed: Jan. 30, 2012

(65) Prior Publication Data

US 2012/0126272 A1 May 24, 2012

Related U.S. Application Data

(63) Continuation of application No. PCT/JP2010/005520, filed on Sep. 9, 2010.

(30) Foreign Application Priority Data

Sep. 29, 2009 (JP) ................................ 2009-225110

(51) Int. Cl.
| | |
|---|---|
| H01L 33/00 | (2010.01) |
| H01L 51/52 | (2006.01) |
| H05B 33/14 | (2006.01) |
| H01L 27/32 | (2006.01) |

(52) U.S. Cl.
CPC ............ H01L 51/5265 (2013.01); H05B 33/14 (2013.01); H01L 27/322 (2013.01); H01L 2251/558 (2013.01)
USPC .......... 257/98; 257/88; 257/40; 257/E33.061; 257/E33.064

(58) Field of Classification Search
USPC ................. 257/98, 88, 40, E33.061, E33.064
See application file for complete search history.

(56) References Cited

U.S. PATENT DOCUMENTS

| | | | |
|---|---|---|---|
| 5,443,922 A | 8/1995 | Nishizaki et al. | |
| 7,888,867 B2 | 2/2011 | Yoshida et al. | |
| 7,932,109 B2 | 4/2011 | Hayata et al. | |
| 8,059,070 B2 | 11/2011 | Odawara et al. | |
| 8,130,177 B2 | 3/2012 | Takagi | |
| 2004/0145303 A1 | 7/2004 | Yamada et al. | |
| 2005/0225233 A1* | 10/2005 | Boroson et al. | ............... 313/504 |
| 2006/0017377 A1 | 1/2006 | Ryu | |

(Continued)

FOREIGN PATENT DOCUMENTS

| | | |
|---|---|---|
| CN | 1868240 | 11/2006 |
| CN | 101257037 | 9/2008 |

(Continued)

OTHER PUBLICATIONS

U.S. Appl. No. 13/292,595 to Yosuke Izawa, filed Nov. 9, 2011.

(Continued)

*Primary Examiner* — Timor Karimy
(74) *Attorney, Agent, or Firm* — Greenblum & Bernstein, P.L.C.

(57) ABSTRACT

A light-emitting element that has an improved light-extraction efficiency and an improved color purity of an emitted light. A light-emitting element includes a reflective electrode, a transparent electrode, a light-emitting layer, a functional layer, and a color filter. An optical film thickness of the functional layer is from approximately 218 nm to approximately 238 nm for a light emitting element that emits a blue light. An optical film thickness of the functional layer is from approximately 384 nm to approximately 400 nm for a light emitting element that emits a red light.

13 Claims, 17 Drawing Sheets

(56) References Cited

U.S. PATENT DOCUMENTS

| | | |
|---|---|---|
| 2007/0029539 A1* | 2/2007 | Yashima et al. .............. 257/13 |
| 2007/0102737 A1 | 5/2007 | Kashiwabara et al. |
| 2007/0145350 A1 | 6/2007 | Kobori |
| 2007/0159073 A1 | 7/2007 | Tsutsui et al. |
| 2008/0203898 A1 | 8/2008 | Kobayashi |
| 2008/0252206 A1 | 10/2008 | Ryu |
| 2010/0084646 A1 | 4/2010 | Matsusue et al. |
| 2010/0171415 A1 | 7/2010 | Akamatsu et al. |
| 2010/0182222 A1 | 7/2010 | Ichihashi et al. |
| 2010/0182352 A1 | 7/2010 | Nakamura et al. |
| 2010/0214273 A1 | 8/2010 | Shirouzu et al. |
| 2010/0220118 A1 | 9/2010 | Kanegae et al. |
| 2010/0252857 A1 | 10/2010 | Yoshida |
| 2010/0253706 A1 | 10/2010 | Shirouzu |
| 2010/0309101 A1 | 12/2010 | Kanegae et al. |
| 2010/0327297 A1 | 12/2010 | Yoshida et al. |
| 2011/0165517 A1 | 7/2011 | Nishiyama et al. |
| 2011/0180821 A1 | 7/2011 | Matsushima |
| 2011/0198623 A1 | 8/2011 | Matsushima |
| 2011/0198624 A1 | 8/2011 | Matsushima |
| 2011/0204410 A1 | 8/2011 | Yada |
| 2011/0234911 A1 | 9/2011 | Nakamura |
| 2011/0272677 A1 | 11/2011 | Takeuchi |
| 2011/0291087 A1 | 12/2011 | Harada et al. |
| 2011/0291128 A1 | 12/2011 | Harada et al. |
| 2011/0316414 A1 | 12/2011 | Nendai |
| 2012/0025224 A1 | 2/2012 | Yuasa |
| 2012/0025699 A1 | 2/2012 | Okumoto et al. |
| 2012/0032207 A1 | 2/2012 | Nishiyama et al. |
| 2012/0040478 A1 | 2/2012 | Takeuchi |
| 2012/0049175 A1 | 3/2012 | Ono et al. |
| 2012/0049211 A1 | 3/2012 | Komatsu et al. |

FOREIGN PATENT DOCUMENTS

| | | |
|---|---|---|
| JP | 5-163488 | 6/1993 |
| JP | 9-92466 | 4/1997 |
| JP | 2005-116516 | 4/2005 |
| JP | 2006-41471 | 2/2006 |
| JP | 2007-157514 | 6/2007 |
| JP | 2010-251156 | 11/2010 |
| KR | 10-2004-0031608 | 4/2004 |

OTHER PUBLICATIONS

U.S. Appl. No. 13/281,841 to Arinobu Kanegae, filed Oct. 26, 2011.
U.S. Appl. No. 13/281,691 to Arinobu Kanegae, filed Oct. 26, 2011.
U.S. Appl. No. 13/331,279 to Masafumi Matsui et al., filed Dec. 20, 2011.
U.S. Appl. No. 13/370,842 to Yasuo Segawa, filed Feb. 10, 2012.
U.S. Appl. No. 13/296,725 to Seiji Nishiyama et al., filed Nov. 15, 2011.
U.S. Appl. No. 13/287,526 to Keiko Kurata et al., filed Nov. 2, 2011.
U.S. Appl. No. 13/360,984 to Satoru Ohuchi et al., filed Jan. 30, 2012.
U.S. Appl. No. 13/361,280 to Takashi Isobe et al., filed Jan. 30, 2012.
U.S. Appl. No. 13/309,775 to Hideaki Matsushima, filed Dec. 2, 2011.
U.S. Appl. No. 13/309,768 to Hideaki Matsushima, filed Dec. 2, 2011.
U.S. Appl. No. 13/313,206 to Hideaki Matsushima, filed Dec. 7, 2011.
U.S. Appl. No. 13/313,214 to Hideaki Matsushima, filed Dec. 7, 2011.
China Office Action (together with partial English language translation thereof), mailed Jan. 23, 2014, from the State Intellectual Property Office (SIPO), for Chinese Patent Application No. 201080025523.1.

* cited by examiner

FIG. 2A

|  | n | k | Film thickness d, in nm |
|---|---|---|---|
| Transparent electrode | 2.035 | 0.000 | 100 |
| Electron transport layer | 1.882 | 0.026 | 30 |
| Light-emitting layer (B) | 1.730 | 0.030 | 60 |
| Hole transport layer | 1.790 | 0.002 | 20 |
| Hole injection layer | 2.010 | 0.000 | 40 |
| Transparent conductive layer | 2.035 | 0.000 | x |
| Reflective electrode | 0.138 | 2.640 | 150 |

Note: values are for 470 nm

FIG. 2B

|  | x | Total optical film thickness L, in nm | Resonance wavelength $\lambda$, in nm |
|---|---|---|---|
| Chromaticity prioritized | 50 | 218 | 256 |
|  | 55 | 228 | 268 |
|  | 60 | 238 | 280 |
| Efficiency prioritized | 95 | 310 | 364 |
|  | 100 | 320 | 376 |
|  | 105 | 330 | 388 |

FIG. 3A

|  | n | k | Film thickness d, in nm |
|---|---|---|---|
| Transparent electrode | 2.035 | 0.000 | 100 |
| Electron transport layer | 1.794 | 0.003 | 30 |
| Light-emitting layer (R) | 1.683 | 0.009 | 80 |
| Hole transport layer | 1.680 | 0.033 | 20 |
| Hole injection layer | 1.930 | 0.000 | 40 |
| Transparent conductive layer | 1.940 | 0.000 | x |
| Reflective electrode | 0.131 | 3.880 | 150 |

Note: values are for 625 nm

FIG. 3B

|  | x | Total optical film thickness L, in nm | Resonance wavelength $\lambda$, in nm |
|---|---|---|---|
| Chromaticity prioritized | 141 | 384 | 452 |
| | 144 | 390 | 459 |
| | 149 | 400 | 470 |
| Efficiency prioritized | 131 | 365 | 429 |
| | 136 | 375 | 441 |

FIG. 4

|  |  |  | Without CF | | | With CF | | |
|---|---|---|---|---|---|---|---|---|
|  |  | ITO (nm) | Efficiency (cd/A) | Chromaticity x | Chromaticity y | Efficiency (cd/A) | Chromaticity x | Chromaticity y | CF transmittance (%) |
| Red | Chromaticity prioritized | 144 | 2.2 | 0.62 | 0.38 | 1.2 | 0.67 | 0.33 | 54 |
| Red | Efficiency prioritized | 136 | 2.3 | 0.61 | 0.39 | 1.1 | 0.67 | 0.33 | 48 |
| Green | Chromaticity prioritized | 90 | 6.4 | 0.29 | 0.65 | 6.2 | 0.29 | 0.65 | 97 |
| Green | Efficiency prioritized | 107 | 7.4 | 0.34 | 0.63 | 5.9 | 0.29 | 0.67 | 80 |
| Blue | Chromaticity prioritized | 55 | 1.9 | 0.13 | 0.13 | 1.1 | 0.13 | 0.09 | 56 |
| Blue | Efficiency prioritized | 100 | 4.9 | 0.13 | 0.31 | 0.37 | 0.12 | 0.09 | 7.6 |

Note: header has 10 columns; "CF transmittance (%)" belongs to the With CF section.

LIGHT-EMITTING ELEMENT AND DISPLAY DEVICE USING SAME

CROSS-REFERENCE TO RELATED APPLICATIONS

This is a continuation application of PCT Application No. PCT/JP2010/005520 filed on Sep. 9, 2010, designating the United States of America, the disclosure of which, including the specification, drawings and claims, is incorporated herein by reference in its entirety.

The disclosure of Japanese Patent Application No. 2009-225110 filed on Sep. 29, 2009, including the specification, drawings, and claims, is incorporated herein by reference in its entirety.

TECHNICAL FIELD

The present invention relates to light-emitting elements that rely on the phenomenon of electroluminescence of organic material and to display devices that use the same.

BACKGROUND ART

In recent years, progress has been made in the research and development of organic electroluminescent elements, which are light-emitting elements that rely on the phenomenon of electroluminescence of organic material. In a structure proposed for a display device using these light-emitting elements, blue, green, and red light-emitting elements are arranged on a substrate.

It is important to improve light-extraction efficiency in the light-emitting elements, for example from the standpoint of reducing power consumption. Conventionally, technology has therefore been proposed to improve light-extraction efficiency by adopting a resonator (cavity) structure in the light-emitting element (see, for example, Patent Literature 1). Patent Literature 1 discloses light-emitting elements in which a lower electrode (mirror), transparent conductive layer, hole transport layer, light-emitting layer, electron transport layer, and upper electrode (half mirror) are laminated, and discloses adjusting optical distance between the mirror and the half mirror in order to maximize the blue, green, and red light-extraction efficiency (paragraph 0012).

Furthermore, in addition to improving light-extraction efficiency in the display device, it is also important to achieve excellent color reproducibility. In order to improve color reproducibility, it is necessary to improve the color purity of the light-emitting elements of each color. Technology has been proposed for improving such color purity of emitted light by providing a color filter above the light-emitting elements, thereby excluding unwanted wavelength components.

CITATION LIST

Patent Literature

Patent Literature 1: Japanese Patent Application Publication No. 2005-116516

SUMMARY OF INVENTION

Technical Problem

Through research, however, the inventors discovered that it is difficult to combine improvement in light-extraction efficiency with improvement in color purity of emitted light by simply combining a cavity structure with a color filter.

It is an object of the present invention to provide a light-emitting element that improves both light-extraction efficiency and color purity of emitted light, and to provide a display device that achieves excellent color reproducibility by using such a light-emitting element.

Solution to Problem

A light-emitting element according to an aspect of the present invention comprises a reflective electrode that reflects incident light; a transparent electrode, disposed to face the reflective electrode, that transmits incident light; a light-emitting layer, disposed between the reflective electrode and the transparent electrode, that emits blue light; a functional layer disposed between the reflective electrode and the light-emitting layer and composed of one or more layers; and a color filter disposed above the light-emitting layer, with the transparent electrode being interposed therebetween, wherein a portion of blue light emitted from the light-emitting layer travels a first optical path by passing through the functional layer, striking and being reflected by the reflective electrode, and then being emitted externally after passing through the functional layer, the light-emitting layer, the transparent electrode, and the color filter, a remaining portion of blue light emitted from the light-emitting layer travels a second optical path by travelling towards the transparent electrode, instead of towards the reflective electrode, and being emitted externally after passing through the transparent electrode and the color filter, and an optical film thickness of the functional layer is from 218 nm to 238 nm inclusive.

Advantageous Effects of Invention

Through research, the inventors discovered that the above structure allows for improvement of both light-extraction efficiency as well as color purity of emitted light. Details are described below with reference to experiment results.

BRIEF DESCRIPTION OF DRAWINGS

FIGS. 2A and 2B show design conditions for a blue light-emitting element, with FIG. 2A showing the refractive index n, the extinction coefficient k, and the film thickness d, and FIG. 2B showing total optical film thickness L and resonance wavelength λ when changing the film thickness of the transparent conductive layer.

FIGS. 3A and 3B show design conditions for a red light-emitting element, with FIG. 3A showing the refractive index n, the extinction coefficient k, and the film thickness d, and FIG. 3B showing total optical film thickness L and resonance wavelength λ when changing the film thickness of the transparent conductive layer.

FIG. 4 is for comparing the light-extraction efficiency and chromaticity of the light-emitting element of each color when prioritizing chromaticity in the design and when prioritizing efficiency in the design.

DESCRIPTION OF EMBODIMENTS

Figure 1:
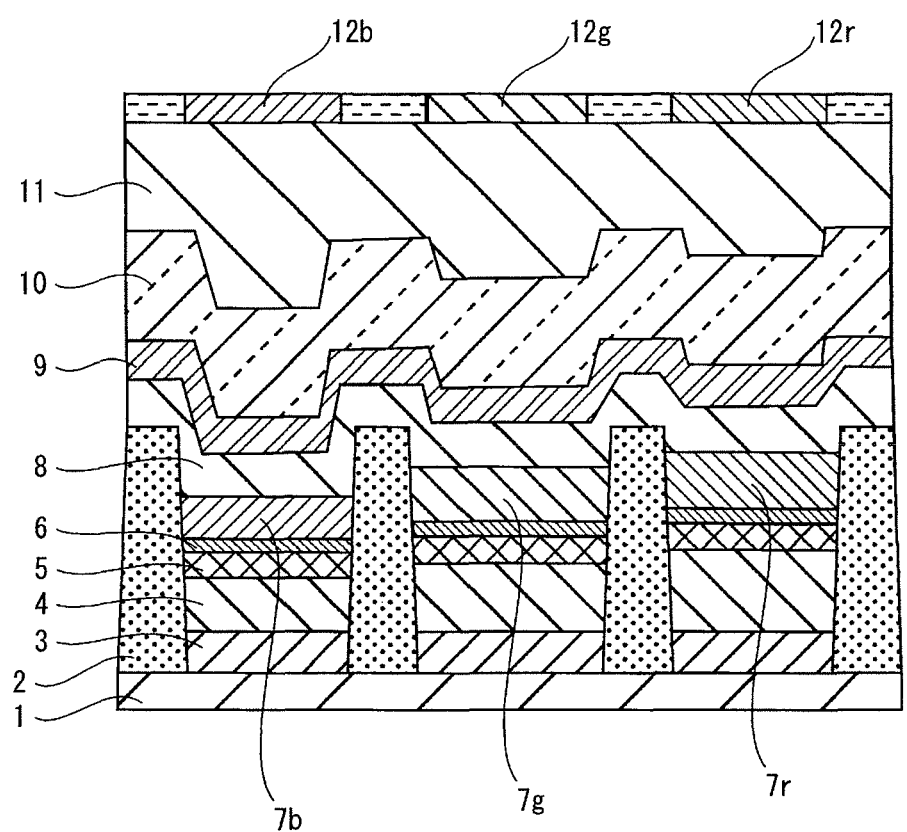
FIG. 1 is a cross-section diagram schematically showing the pixel structure of the display device according to an aspect of the present invention.

[Outline of Aspects of the Present Invention]

A light-emitting element according to a first aspect of the present invention comprises a reflective electrode that reflects incident light; a transparent electrode, disposed to face the reflective electrode, that transmits incident light; a light-emitting layer, disposed between the reflective electrode and the transparent electrode, that emits blue light; a functional layer disposed between the reflective electrode and the light-emitting layer and composed of one or more layers; and a color filter disposed above the light-emitting layer, with the transparent electrode being interposed therebetween, wherein a portion of blue light emitted from the light-emitting layer travels a first optical path by passing through the functional layer, striking and being reflected by the reflective electrode, and then being emitted externally after passing through the functional layer, the light-emitting layer, the transparent electrode, and the color filter, a remaining portion of blue light emitted from the light-emitting layer travels a second optical path by travelling towards the transparent electrode, instead of towards the reflective electrode, and being emitted externally after passing through the transparent electrode and the color filter, and an optical film thickness of the functional layer is from 218 nm to 238 nm inclusive. With this structure, a blue light-emitting element has both improved light-extraction efficiency and improved color purity of emitted light.

A light-emitting element according to a second aspect of the present invention comprises: a reflective electrode that reflects incident light; a transparent electrode, disposed to face the reflective electrode, that transmits incident light; a light-emitting layer, disposed between the reflective electrode and the transparent electrode, that emits blue light; a functional layer disposed between the reflective electrode and the light-emitting layer and composed of one or more layers; and a color filter disposed above the light-emitting layer, with the transparent electrode being interposed therebetween, wherein a portion of blue light emitted from the light-emitting layer travels a first optical path by passing through the functional layer, striking and being reflected by the reflective electrode, and then being emitted externally after passing through the functional layer, the light-emitting layer, the transparent electrode, and the color filter, a remaining portion of blue light emitted from the light-emitting layer travels a second optical path by travelling towards the transparent electrode, instead of towards the reflective electrode, and being emitted externally after passing through the transparent electrode and the color filter, and an optical film thickness L in nm of the functional layer satisfies the following equation.

$$\frac{2L}{\lambda} + \frac{\Phi}{2\pi} = m \qquad \text{Math 1}$$

Here, $\lambda$ is a wavelength having a value from 256 nm to 280 nm inclusive, $\Phi$ is a phase shift at the reflective electrode, and m is an integer. With this structure, a blue light-emitting element has both improved light-extraction efficiency and improved color purity of emitted light.

A spectral intensity of light passing through the color filter may be at a maximum value in a first wavelength range in which a spectral intensity of blue light passing through the transparent electrode is at a maximum value, and in a second wavelength range of longer wavelengths than the first wavelength range and a third wavelength range of shorter wavelengths than the first wavelength range, the spectral intensity of light passing through the color filter may be less than the maximum value in the first wavelength range. With respect to blue light passing through the transparent electrode, the color filter may reduce passage of light components that are in the second wavelength range, are unnecessary for achieving a target chromaticity, and have a spectral intensity less than the maximum value, and the color filter may allow passage of light components in the first wavelength range and in the third wavelength range. In this way, among blue light that strikes the color filter after passing through the transparent electrode, the color filter reduces passage of unnecessary light components while allowing light components other than the unnecessary light components to pass through the color filter to the outside. In particular, since extraction of light components whose spectral intensity is the maximum value is efficient, blue light that has been adjusted to the target chromaticity is efficiently emitted externally.

A light-emitting element according to a third aspect of the present invention comprises: a reflective electrode that reflects incident light; a transparent electrode, disposed to face the reflective electrode, that transmits incident light; a light-emitting layer, disposed between the reflective electrode and the transparent electrode, that emits red light; a functional layer disposed between the reflective electrode and the light-emitting layer and composed of one or more layers; and a color filter disposed above the light-emitting layer, with the transparent electrode being interposed therebetween, wherein a portion of red light emitted from the light-emitting layer travels a first optical path by passing through the functional layer, striking and being reflected by the reflective electrode, and then being emitted externally after passing through the functional layer, the light-emitting layer, the transparent electrode, and the color filter, a remaining portion of red light emitted from the light-emitting layer travels a second optical path by travelling towards the transparent electrode, instead of towards the reflective electrode, and being emitted externally after passing through the transparent electrode and the color filter, and an optical film thickness of the functional layer is from 384 nm to 400 nm inclusive. With this structure, a red light-emitting element has both improved light-extraction efficiency and improved color purity of emitted light.

A light-emitting element according to a fourth aspect of the present invention comprises: a reflective electrode that reflects incident light; a transparent electrode, disposed to face the reflective electrode, that transmits incident light; a light-emitting layer, disposed between the reflective electrode and the transparent electrode, that emits red light; a functional layer disposed between the reflective electrode and the light-emitting layer and composed of one or more layers; and a color filter disposed above the light-emitting layer, with the transparent electrode being interposed therebetween, wherein a portion of red light emitted from the light-emitting layer travels a first optical path by passing through the functional layer, striking and being reflected by the reflective electrode, and then being emitted externally after passing through the functional layer, the light-emitting layer, the transparent electrode, and the color filter, a remaining portion of red light emitted from the light-emitting layer travels a second optical path by travelling towards the transparent electrode, instead of towards the reflective electrode, and being emitted externally after passing through the transparent electrode and the color filter, and an optical film thickness L in nm of the functional layer satisfies the following equation.

$$\frac{2L}{\lambda} + \frac{\Phi}{2\pi} = m \qquad \text{Math 1}$$

Here, $\lambda$ is a wavelength having a value from 452 nm to 470 nm inclusive, $\Phi$ is a phase shift at the reflective electrode, and m is an integer. With this structure, a red light-emitting element has both improved light-extraction efficiency and improved color purity of emitted light.

A display device according to a fifth aspect of the present invention comprises an array of blue, green, and red light-emitting elements on a substrate, wherein each of the blue light-emitting elements is the light-emitting element according to the first aspect. This structure improves the light-extraction efficiency of blue light, thus allowing for a reduction in power consumption of the display device, while also improving the color purity of emitted light, thereby improving color reproducibility of images.

Furthermore, each of the red light-emitting elements may be the light-emitting element according to the third aspect. This structure improves the light-extraction efficiency and the color purity of red light, thus allowing for a reduction in power consumption of the display device and further improving color reproducibility of images.

A display device according to a sixth aspect of the present invention comprises an array of blue, green, and red light-emitting elements on a substrate, wherein each of the blue light-emitting elements is the light-emitting element according to the second aspect. This structure improves the light-extraction efficiency of blue light, thus allowing for a reduction in power consumption of the display device, while also improving the color purity of emitted light, thereby improving color reproducibility of images.

Furthermore, each of the red light-emitting elements may be the light-emitting element according to the fourth aspect. This structure improves the light-extraction efficiency and the color purity of red light, thus allowing for a reduction in power consumption of the display device and further improving color reproducibility of images.

[Structure of Display Device and Light-Emitting Element]

The following describes an example of an aspect of the present invention in detail with reference to the drawings.

FIG. 1 is a cross-section diagram schematically showing the pixel structure of a display device according to an aspect of the present invention. The display device is an organic EL display having blue (B), green (G), and red (R) pixels arranged regularly in a matrix of rows and columns. Each pixel is formed by a light-emitting element that uses an organic material.

The blue light-emitting element is a laminate of the following layers in this order: a substrate 1, a reflective electrode 3, a transparent conductive layer 4, a hole injection layer 5, a hole transport layer 6, a light-emitting layer 7b, an electron transport layer 8, a transparent electrode 9, a thin-film passivation layer 10, a resin passivation layer 11, and a color filter 12b. In other words, the light-emitting layer 7b is provided between the reflective electrode 3 and the transparent electrode 9. A functional layer that includes three layers (the transparent conductive layer 4, the hole injection layer 5, and the hole transport layer 6) is provided between the reflective electrode 3 and the light-emitting layer 7b.

The green light-emitting element has the same structure as the blue light-emitting element, except for a light-emitting layer 7g and a color filter 12g. The red light-emitting element has the same structure as the blue light-emitting element, except for a light-emitting layer 7r and a color filter 12r. In this example, the light-emitting elements of each color share the same substrate 1, electron transport layer 8, transparent electrode 9, thin-film passivation layer 10, and resin passivation layer 11.

Furthermore, the light-emitting element of each color achieves a one-sided reflective cavity structure due to the reflective electrode 3 and the transparent electrode 9. A first optical path and a second optical path are formed in the light-emitting elements, the first optical path being traveled by a portion of light emitted from the light-emitting layers 7b, 7g, and 7r that passes through the functional layer, strikes and is reflected by the reflective electrode 3, and then is emitted externally after passing through the functional layer, the light-emitting layers 7b, 7g, and 7r, and the transparent electrode 9, and the second optical path being traveled by a remaining portion of light emitted from the light-emitting layers 7b, 7g, and 7r that travels towards the transparent electrode 9, instead of travelling towards the reflective electrode 3, and is emitted externally after passing through the transparent electrode 9. Light that is emitted externally after passing through the transparent electrode 9 includes both a component that travels the first optical path (hereinafter, "reflected light"), and a component that travels the second optical path (hereinafter, "direct light"). By adjusting the distance between the reflective electrode 3 and the light-emitting layers 7b, 7g, and 7r so that the direct light and the reflected light strengthen each other through an interference effect, the light-extraction efficiency of the light-emitting element is improved. Adjustment of the distance is achieved by adjusting the film thickness of the functional layer provided between the reflective electrode 3 and the light-emitting layers 7b, 7g, and 7r.

Specifically, in the blue light-emitting element, the film thickness of the transparent conductive layer 4 is set to be from 50 nm to 60 nm inclusive, the film thickness of the hole injection layer 5 is set to be 40 nm, and the film thickness of the hole transport layer 6 is set to be 20 nm, so that the total optical film thickness L is from 218 nm to 238 nm inclusive. The optical film thickness refers to the physical quantity obtained by multiplying the film thickness d of each layer by the respective refractive index n of the layer. Note that in the blue light-emitting element, it is preferable to set the film thickness of the transparent conductive layer 4 to 55 nm. The above range of 50 nm to 60 nm inclusive was achieved by assuming, for a design value of 55 nm, that manufacturing error would occur in a range from −5 nm to +5 nm.

In the green light-emitting element, the film thickness of the transparent conductive layer 4 is set to 90 nm, and the film thickness of the hole injection layer 5 and of the hole transport layer 6 is the same as the blue light-emitting element.

In the red light-emitting element, the film thickness of the transparent conductive layer 4 is from 141 nm to 149 nm inclusive, and the film thickness of the hole injection layer 5 and of the hole transport layer 6 is the same as the blue light-emitting element, so that the total optical film thickness L is from 384 nm to 400 nm inclusive. Note that in the red light-emitting element, it is preferable to set the film thickness of the transparent conductive layer 4 to 144 nm. The above range of 141 nm to 149 nm inclusive was achieved by assuming, for a design value of 144 nm, that manufacturing error would occur in a range from −3 nm to +5 nm.

Thus adjusting the film thickness of the functional layer in the light-emitting element of each color to be within the above range that includes manufacturing error allows for improvement of light-extraction efficiency while also improving the color purity of emitted light. The following describes the reasons behind such improvement.

[Experiments and Simulations]

The inventors compared the light-extraction efficiency and chromaticity of the light-emitting element of each color when prioritizing chromaticity in the design and when prioritizing efficiency in the design.

A target chromaticity is determined for each color in the display device. Prioritizing chromaticity refers to a design method for setting the distance between the light-emitting layer and the reflective electrode so that the chromaticity of emitted light approaches the target chromaticity, and then setting the characteristics of the color filter in order to further approach the target chromaticity. Prioritizing efficiency refers to a design method for setting the distance between the light-emitting layer and the reflective electrode so that the intensity of emitted light is maximized, and then setting the characteristics of the color filter so that the chromaticity of emitted light approaches the target chromaticity.

In order to increase the light-extraction efficiency of the light-emitting element, prioritizing efficiency in design would appear to be the best approach. However, when comparing the prioritization of chromaticity with the prioritization of efficiency, contrary to expectation it was discovered that a design prioritizing chromaticity resulted in higher light-extraction efficiency.

<Conditions>

FIGS. 2A and 2B show design conditions for a blue light-emitting element, with FIG. 2A showing the refractive index n, the extinction coefficient k, and the film thickness d, and FIG. 2B showing total optical film thickness L and resonance wavelength λ, when changing the film thickness of the transparent conductive layer. In this case, the material for the transparent conductive layer 4 is Indium Tin Oxide (ITO), and the material for the light-emitting layer 7b is BP105 by SUMATION Co.

As shown in FIGS. 2A and 2B, in the blue light-emitting element, when prioritizing chromaticity in the design, the film thickness d of the transparent conductive layer 4 is from 50 nm to 60 nm inclusive, and the total optical film thickness L in this case is from 218 nm to 238 nm inclusive. On the other hand, when prioritizing efficiency in the design, the film thickness d of the transparent conductive layer 4 is from 95 nm to 105 nm inclusive, and the total optical film thickness L in this case is from 310 nm to 330 nm inclusive.

FIGS. 3A and 3B show design conditions for the red light-emitting element. In the red light-emitting element, only the material for the light-emitting layer 7r and the film thickness of the transparent conductive layer 4 differ from the blue light-emitting element. In this case, the material for the light-emitting layer 7r is RP158 by SUMATION Co. While the design conditions for the green light-emitting element are not particularly shown in the figures, the material for the light-emitting layer 7g is GP1200 by SUMATION Co.

As shown in FIGS. 3A and 3B, in the red light-emitting element, when prioritizing chromaticity in the design, the film thickness d of the transparent conductive layer 4 is from 141 nm to 149 nm inclusive, and the total optical film thickness L in this case is from 384 nm to 400 nm inclusive. On the other hand, when prioritizing efficiency in the design, the film thickness d of the transparent conductive layer 4 is from 131 nm to 136 nm inclusive, and the total optical film thickness L in this case is from 365 nm to 375 nm inclusive.

<Comparison of Light-Extraction Efficiency and Chromaticity>

FIG. 4 is for comparing the light-extraction efficiency and chromaticity of the light-emitting element of each color when prioritizing chromaticity in the design and when prioritizing efficiency in the design.

In the blue light-emitting element, the film thickness of the transparent conductive layer 4 when prioritizing chromaticity is set to 55 nm, and the film thickness of the transparent conductive layer 4 when prioritizing efficiency is set to 100 nm.

First, for the case when a color filter is not provided, the chromaticity (x, y) is (0.13, 0.13) when prioritizing chromaticity and (0.13, 0.31) when prioritizing efficiency. In this context, the chromaticity (x, y) indicates a position on a CIE chromaticity diagram. In the display device, the target chromaticity for blue is set in the neighborhood of (0.15, 0.06-0.09), and therefore the value when prioritizing chromaticity is nearer the target chromaticity than when prioritizing efficiency. Furthermore, light-extraction efficiency is 1.9 cd/A when prioritizing chromaticity and 4.9 cd/A when prioritizing efficiency. In other words, light-extraction efficiency is higher when prioritizing efficiency than when prioritizing chromaticity.

Next, comparing the chromaticity of emitted light when providing a color filter for further approaching the target chromaticity, the chromaticity (x, y) was (0.13, 0.09) when prioritizing chromaticity and (0.12, 0.09) when prioritizing efficiency. By thus providing a color filter, the target chromaticity can be approached both when prioritizing chromaticity and when prioritizing efficiency, thereby heightening the color purity of emitted light. On the other hand, light-extraction efficiency is 1.1 cd/A when prioritizing chromaticity and 0.37 cd/A when prioritizing efficiency. In other words, when providing a color filter, the resulting light-extraction efficiency is lower when prioritizing efficiency than when prioritizing chromaticity.

The color filter (CF) transmittance in FIG. 4 is a comparison between the light-extraction efficiency when not providing a color filter and the light-extraction efficiency when providing a color filter. In the blue light-emitting element, the CF transmittance when prioritizing chromaticity is 56%, whereas the CF transmittance is 7.6% when prioritizing efficiency. This means that when prioritizing chromaticity, the light-extraction efficiency does not decrease very much when providing a color filter, yet when prioritizing efficiency, the light-extraction efficiency decreases dramatically when providing a color filter. As shown in FIGS. 2A and 2B, the same tendency is observed in the green and red light-emitting elements, albeit not as remarkably as in the blue light-emitting element.

Figure 5A:
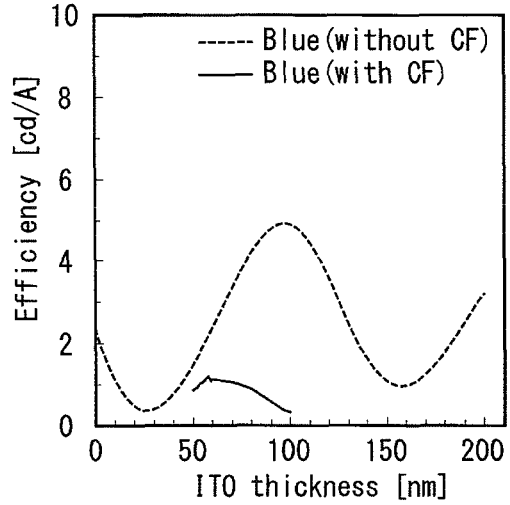
FIGS. 5A, 5B, and 5C show the relationship between the film thickness of the transparent conductive layer and the light-extraction efficiency in the light-emitting elements of each color, with FIG. 5A showing the blue light-emitting element, FIG. 5B showing the green light-emitting element, and FIG. 5C showing the red light-emitting element.
Figure 5B:
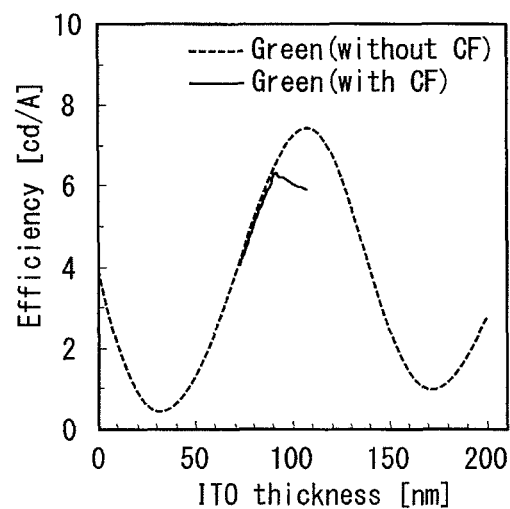
Figure 5C:
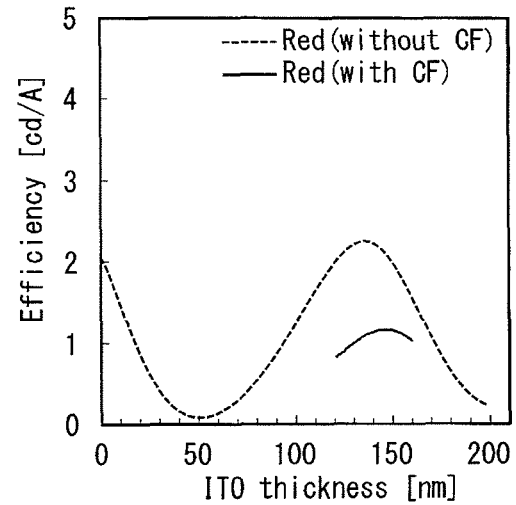

FIGS. 5A, 5B, and 5C show the relationship between the film thickness of the transparent conductive layer and the light-extraction efficiency in the light-emitting elements of each color, with FIG. 5A showing the blue light-emitting element, FIG. 5B showing the green light-emitting element, and FIG. 5C showing the red light-emitting element.

As shown in FIG. 5A, in the case of blue, if no color filter is provided, the light-extraction efficiency is at a maximum in a range of the film thickness from 95 nm to 105 nm. On the other hand, if a color filter is provided, the light-extraction efficiency is at a maximum in a range of the film thickness from 50 nm to 85 nm, and the light-extraction efficiency is smallest at a film thickness of 100 nm. These results clearly indicate that even if efficiency is prioritized in the design, light-extraction efficiency decreases dramatically when providing a color filter in order to approach the target chromaticity. Conversely, if chromaticity is prioritized in the design (with film thickness in a range from 50 nm to 60 nm), light-extraction efficiency does not decrease much even if a color filter is provided.

As shown in FIG. 5B, in the case of green, if no color filter is provided, the light-extraction efficiency is at a maximum for a film thickness in the neighborhood of 107 nm. On the other hand, if a color filter is provided, the light-extraction efficiency is at a maximum for a film thickness in the neighborhood of 90 nm, and the light-extraction efficiency decreases slightly at a film thickness of 107 nm. These results show that if chromaticity is prioritized in the design (with film thickness in the neighborhood of 90 nm), light-extraction efficiency does not decrease much even if a color filter is provided.

As shown in FIG. 5C, in the case of red, if no color filter is provided, the light-extraction efficiency is at a maximum in a range of the film thickness from 131 nm to 136 nm. On the other hand, if a color filter is provided, the light-extraction efficiency is at a maximum in a range of the film thickness from 141 to 149 nm. These results clearly indicate that even if efficiency is prioritized in the design, light-extraction efficiency decreases dramatically when providing a color filter in order to approach the target chromaticity. Conversely, if chromaticity is prioritized in the design (with film thickness in a range from 141 nm to 149 nm), light-extraction efficiency does not decrease much even if a color filter is provided.

Figure 6A:
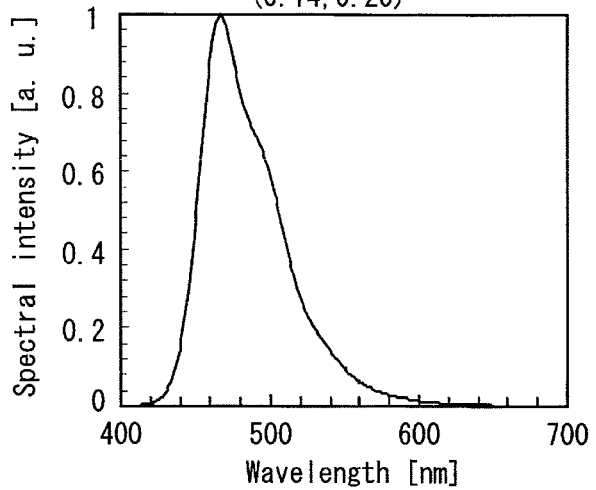
FIGS. 6A, 6B, and 6C show the relationship between spectral intensity and wavelength in the blue light-emitting element, with FIG. 6A showing the spectral intensity of the light-emitting material, FIG. 6B showing the spectral intensity when prioritizing chromaticity in the design, and FIG. 6C showing the spectral intensity when prioritizing efficiency in the design.
Figure 6B:
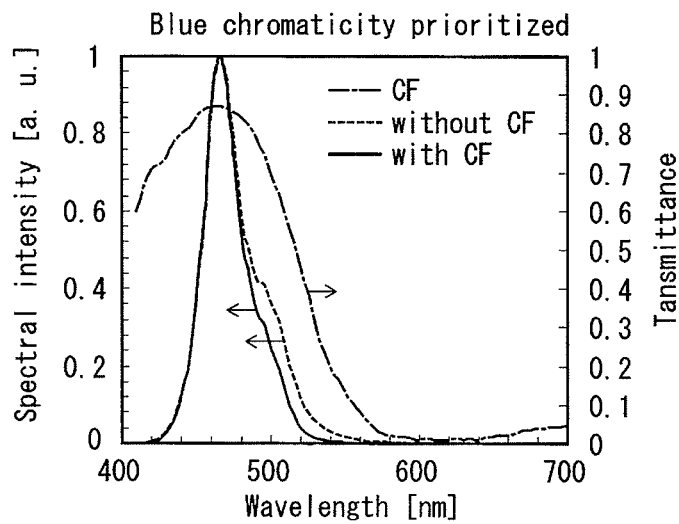
Figure 6C:
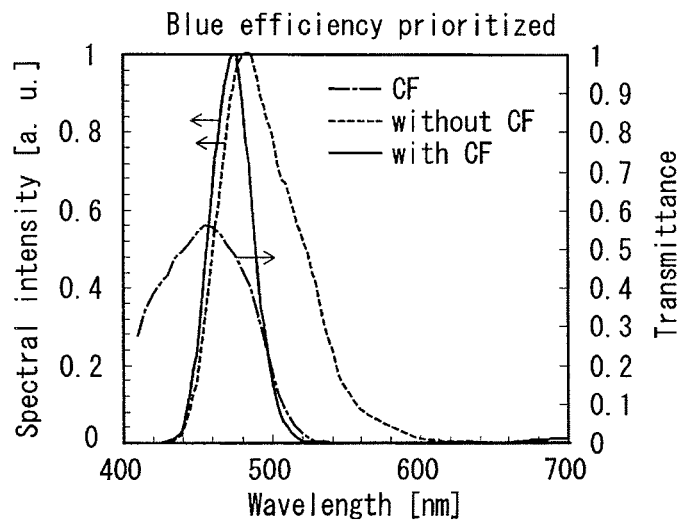
Figure 7A:
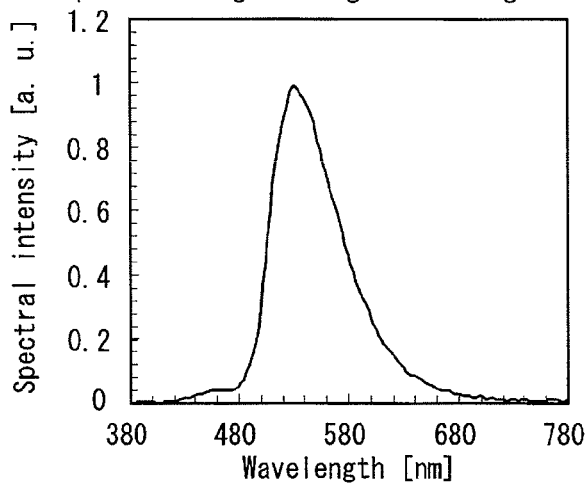
FIGS. 7A, 7B, and 7C show the relationship between spectral intensity and wavelength in the green light-emitting element, with FIG. 7A showing the spectral intensity of the light-emitting material, FIG. 7B showing the spectral intensity when prioritizing chromaticity in the design, and FIG. 7C showing the spectral intensity when prioritizing efficiency in the design.
Figure 7B:
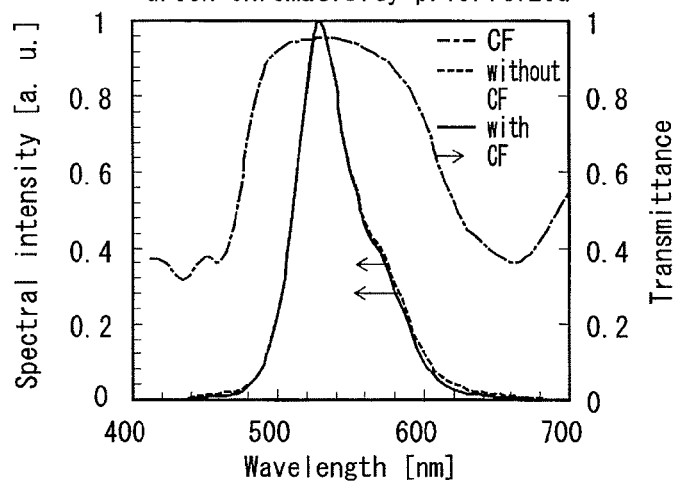
Figure 7C:
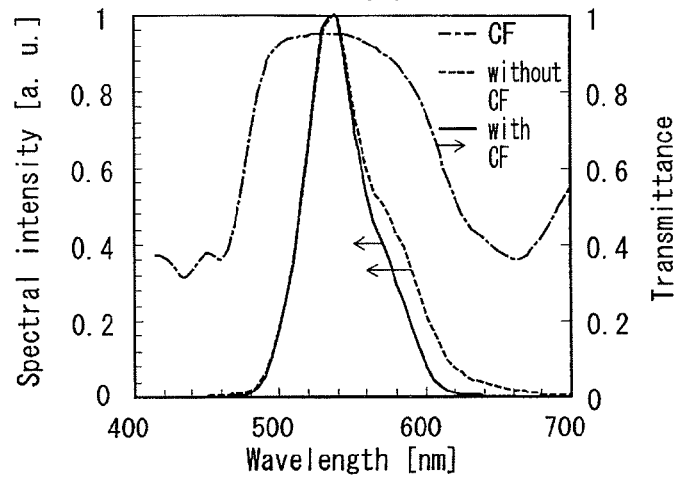
Figure 8A:
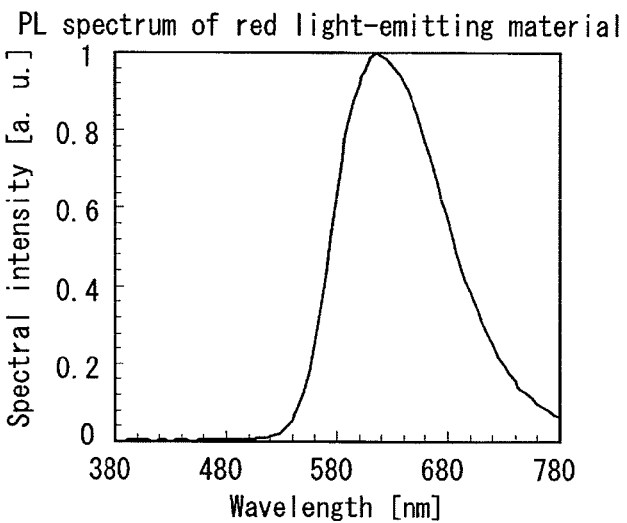
FIGS. 8A, 8B, and 8C show the relationship between spectral intensity and wavelength in the red light-emitting element, with FIG. 8A showing the spectral intensity of the light-emitting material, FIG. 8B showing the spectral intensity when prioritizing chromaticity in the design, and FIG. 8C showing the spectral intensity when prioritizing efficiency in the design.
Figure 8B:
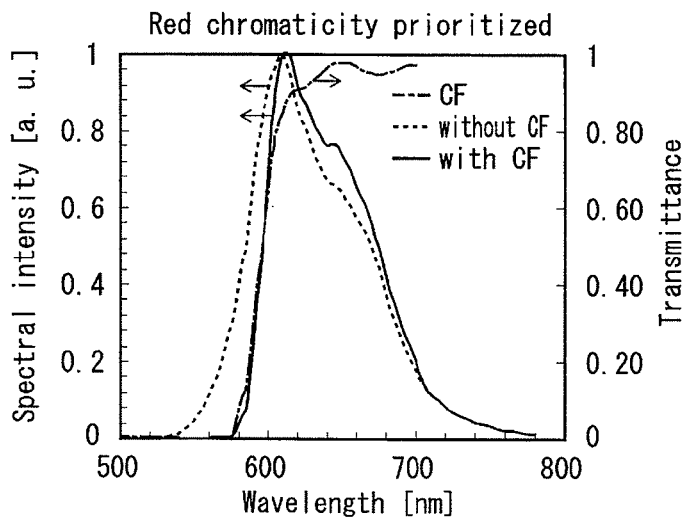
Figure 8C:
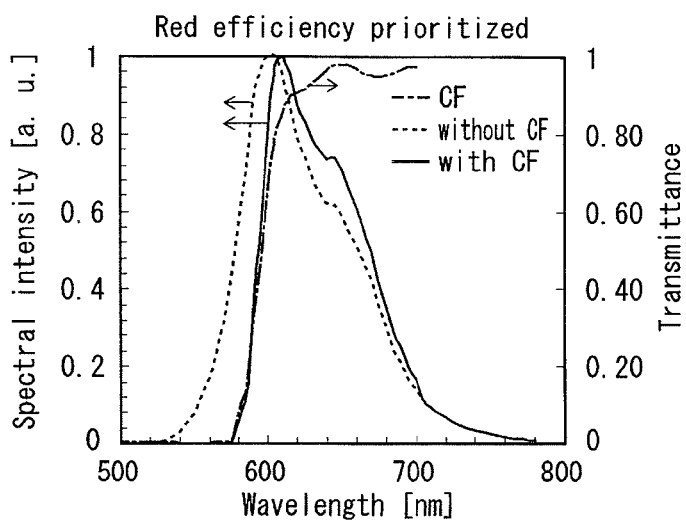

FIGS. 6A, 6B, and 6C show the relationship between spectral intensity and wavelength in the blue light-emitting element, with FIG. 6A showing the spectral intensity of the light-emitting material, FIG. 6B showing the spectral intensity when prioritizing chromaticity in the design, and FIG. 6C showing the spectral intensity when prioritizing efficiency in the design. These results clearly indicate that when a color filter is not provided, the spectral half-value width is smaller when prioritizing chromaticity than when prioritizing efficiency, indicating that unwanted wavelength components are correspondingly fewer. Therefore, a weak spectral correction suffices to approach the target chromaticity (to improve the color purity of the emitted light), and a color filter with a correspondingly high transmittance can be used. Conversely, when prioritizing efficiency, strong spectral correction is necessary to approach the target chromaticity, thus requiring the use of a color filter with a low transmittance. This is considered to be the reason why it is easier to increase light-extraction efficiency while increasing the color purity of emitted light when prioritizing chromaticity in the design than when prioritizing efficiency in the design. As shown in FIGS. 7A-7C and 8A-8C, the same tendency is observed in the green and red light-emitting elements, albeit not as remarkably as in the blue light-emitting element.

Note that as shown in FIG. 6B, the following observations can be made when focusing on the characteristics of the color filter when prioritizing chromaticity.

(1) In a first wavelength range (from 460 nm to 480 nm inclusive) in which the spectral intensity of blue light passing through the transparent electrode 9 is at a maximum value, the spectral intensity of light passing through the color filter is at a maximum value. On the other hand, in a second wavelength range of longer wavelengths than the first wavelength range (greater than 480 nm), and in a third wavelength range of shorter wavelengths than the first wavelength range (less than 460 nm), the spectral intensity of light passing through the color filter is less than the maximum value in the first wavelength range (see the alternating long and short dashed line in FIG. 6B).

(2) With respect to blue light passing through the transparent electrode 9, the color filter reduces passage of light components that are in the second wavelength range (greater than 480 nm), are unnecessary for achieving the target chromaticity, and have a spectral intensity less than the maximum value (a spectral intensity of approximately less than 0.6) (see the difference between the dashed line and the solid line in FIG. 6B). Furthermore, the color filter allows passage of light components in the first wavelength range (from 460 nm to 480 nm inclusive) and in the third wavelength range (less than 460 nm) (see the difference between the dashed line and the solid line in FIG. 6B).

In this way, among blue light that strikes the color filter after passing through the transparent electrode, the color filter reduces passage of unnecessary light components while allowing light components other than the unnecessary light components to pass through the color filter to the outside. In particular, since extraction of light components whose spectral intensity is the maximum value is efficient, blue light that has been adjusted to the target chromaticity is efficiently emitted externally.

<Conclusion>

As shown above, in the blue light-emitting element, setting the film thickness d of the transparent conductive layer 4 to be from 50 nm to 60 nm inclusive allows for improvement of the light-extraction efficiency while improving the color purity of emitted light. This effect is considered to be achieved by interference between direct light and reflected light. Therefore, what is important is not that the film thickness d of the transparent conductive layer 4 be from 50 nm to 60 nm inclusive. Rather, the total optical film thickness L of the transparent conductive layer 4, the hole injection layer 5, and the hole transport layer 6 is what is important. Accordingly, in the blue light-emitting element, the total optical film thickness L of the transparent conductive layer 4, the hole injection layer 5, and the hole transport layer 6 should be from 218 nm to 238 nm inclusive. As long as this condition is fulfilled, similar advantageous effects are achieved.

In the green light-emitting element, setting the film thickness d of the transparent conductive layer 4 to be 90 nm allows for improvement of the light-extraction efficiency while improving the color purity of emitted light.

Furthermore, in the red light-emitting element, setting the film thickness d of the transparent conductive layer 4 to be from 141 nm to 149 nm inclusive allows for improvement of the light-extraction efficiency while improving the color purity of emitted light. For the same reason as for the blue light-emitting element, in the red light-emitting element, the total optical film thickness L of the transparent conductive layer 4, the hole injection layer 5, and the hole transport layer 6 should be from 384 nm to 400 nm inclusive. As long as this condition is fulfilled, similar advantageous effects are achieved.

In a display device using these light-emitting elements, the light-extraction efficiency of the light-emitting elements of each color is high, and the color purity of the emitted light is high, thereby reducing power consumption and improving color reproducibility of images.

Note that in the structure in FIG. 1, a functional layer composed of three layers, i.e. the transparent conductive layer 4, the hole injection layer 5, and the hole transport layer 6, is located between the reflective electrode 3 and each of the light-emitting layers 7b, 7g, and 7r. The light-emitting elements may, however, adopt a different structure. In such a case as well, the same advantageous effects as above are achieved as long as the optical film thickness L of the functional layer between the reflective electrode 3 and each of the light-emitting layers 7b, 7g, and 7r is in the above range.

The following facts can be derived from the above results using a typical analysis method for cavity structures. In the cavity structure, the total optical film thickness L in nm of the transparent conductive layer 4, the hole injection layer 5, and the hole transport layer 6, the resonance wavelength λ in nm, and the phase shift Φ in radians satisfy Equation 1 below.

$$\frac{2L}{\lambda} + \frac{\Phi}{2\pi} = m \qquad \text{Math 1}$$

Here, m is an integer.

The phase shift Φ in the reflective electrode 3 can be calculated from Equation 2 below.

$$\Phi = \tan^{-1}\left(\frac{2n_1 k_o}{n_1^2 - n_0^2 - k_0^2}\right) \qquad \text{Math 2}$$

Here, $n_1$ is the refractive index of the transparent conductive layer 4, $n_0$ is the refractive index of the reflective electrode 3, and $k_0$ is the extinction coefficient of the reflective electrode 3.

FIG. 2B shows the resonance wavelength λ in the blue light-emitting element, and FIG. 3B shows the resonance wavelength λ in the red light-emitting element. These resonance wavelengths were calculated using Equations 1 and 2 above. Here Φ/2π is set to −0.7, and m is set to 1.

FIG. 2B shows that chromaticity can be prioritized in design by considering the wavelength of blue light to be from 256 nm to 280 nm inclusive. In other words, setting the total optical film thickness L in nm to satisfy Equation 1 allows for improvement of the light-extraction efficiency while improving the color purity of emitted light. In this case, the wavelength λ is set to be from 256 nm to 280 nm inclusive, and m is set to an integer.

Similarly, FIG. 3B shows that chromaticity can be prioritized in design by considering the wavelength of red light to be from 452 nm to 470 nm inclusive. In other words, setting the total optical film thickness L in nm to satisfy Equation 1 allows for improvement of the light-extraction efficiency while improving the color purity of emitted light. In this case, the wavelength is set to be from 452 nm to 470 nm inclusive, and m is set to an integer.

<Comparison of Angular Dependence of Chromaticity>

The inventors further compared the angular dependence of chromaticity of the light-emitting elements when prioritizing chromaticity in the design and when prioritizing efficiency in the design.

Figure 9A:
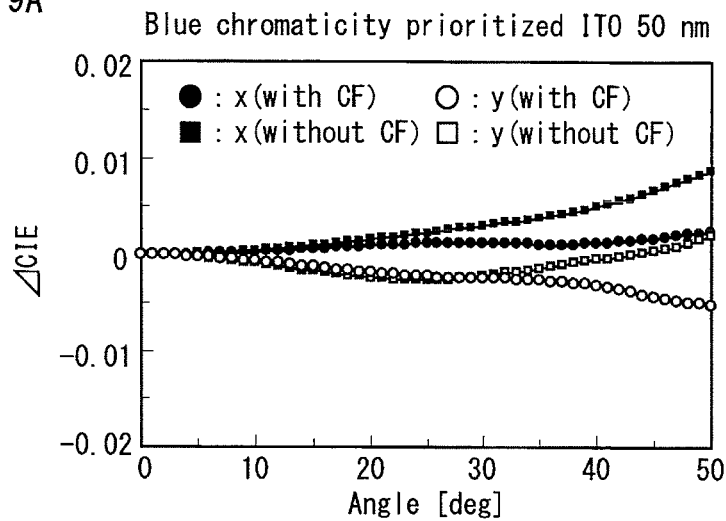
FIGS. 9A, 9B, and 9C show angular dependence of chromaticity when prioritizing chromaticity in the design of the blue light-emitting element, with the film thickness of the transparent conductive layer being 50 nm in FIG. 9A, 55 nm in FIG. 9B, and 60 nm in FIG. 9C.
Figure 9B:
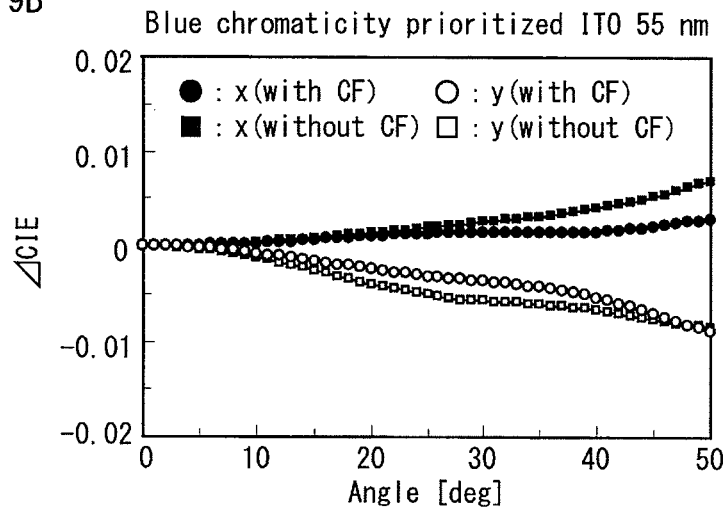
Figure 9C:
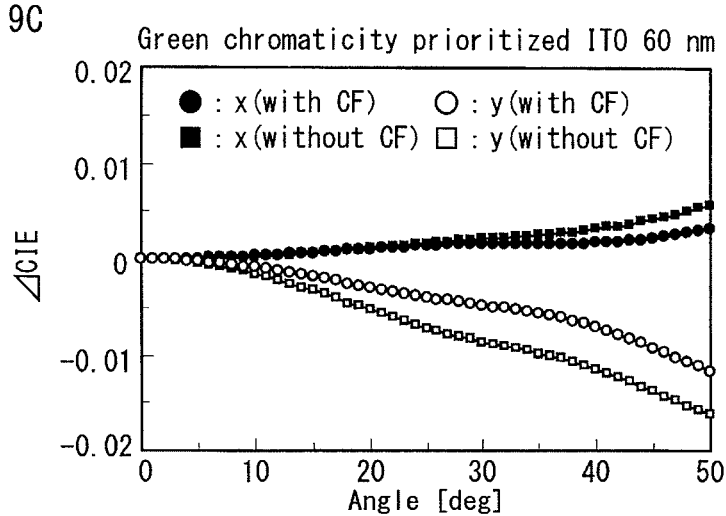
Figure 10A:
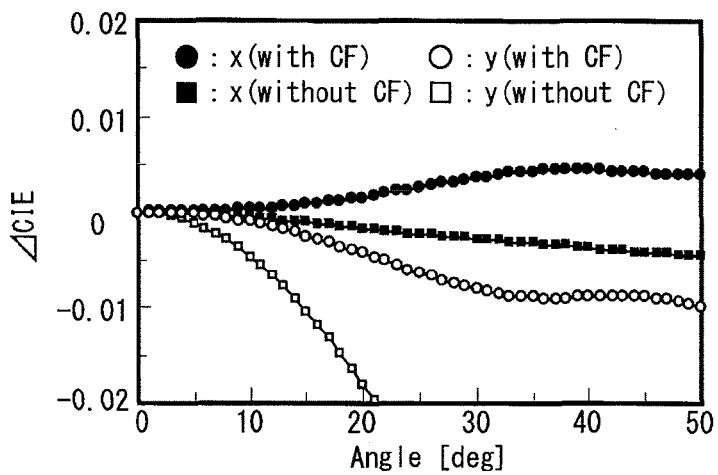
FIGS. 10A, 10B, and 10C show angular dependence of chromaticity when prioritizing efficiency in the design of the blue light-emitting element, with the film thickness of the transparent conductive layer being 95 nm in FIG. 10A, 100 nm in FIG. 10B, and 105 nm in FIG. 10C.
Figure 10B:
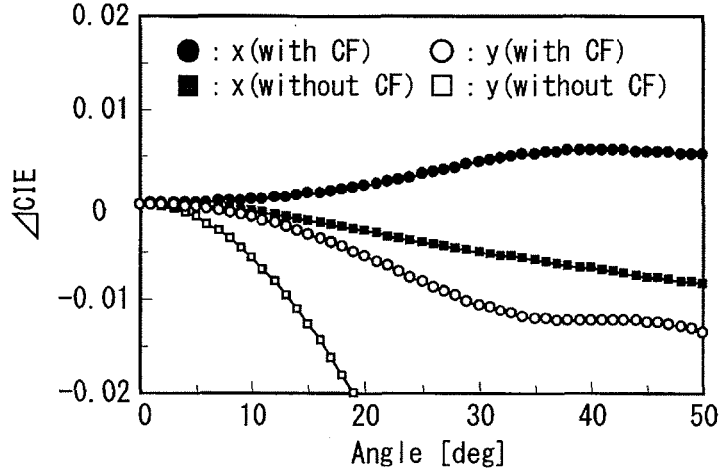
Figure 10C:
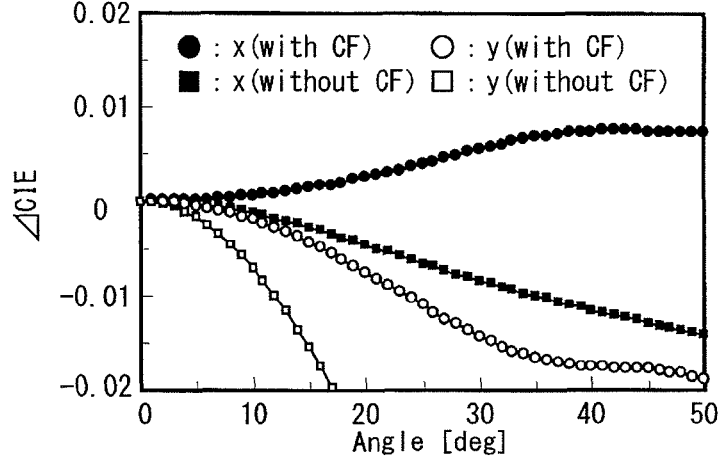

FIGS. 9A, 9B, and 9C show angular dependence of chromaticity when prioritizing chromaticity in the design of the blue light-emitting element, with the film thickness of the transparent conductive layer being 50 nm in FIG. 9A, 55 nm in FIG. 9B, and 60 nm in FIG. 9C. On the other hand, FIGS. 10A, 10B, and 10C show angular dependence of chromaticity when prioritizing efficiency in the design of the blue light-emitting element, with the film thickness of the transparent conductive layer being 95 nm in FIG. 10A, 100 nm in FIG. 10B, and 105 nm in FIG. 10C. The angle is considered to be 0° when viewing the front of the light-emitting element. FIGS. 9A-9C and 10A-10C show ΔCIE, the shift in chromaticity, from a reference chromaticity for when the angle is 0°.

As shown in FIGS. 9A-9C and 10A-10C, in the blue light-emitting element, when no color filter is provided, the shift in chromaticity is large when prioritizing efficiency yet is small when prioritizing chromaticity. Therefore, when prioritizing efficiency, a strong correction of chromaticity with a color filter is necessary, which is the reason why a color filter with a low transmittance needs to be used. Even when a color filter is provided, the shift in chromaticity is smaller when prioritizing chromaticity than when prioritizing efficiency. Therefore, the angular dependence of chromaticity of the blue light-emitting element is reduced by setting the film thickness d of the transparent conductive layer 4 to be from 50 nm to 60 nm inclusive, i.e. setting the total optical film thickness L of the transparent conductive layer 4, the hole injection layer 5, and the hole transport layer 6 to be from 218 nm to 238 nm inclusive.

Figure 11:
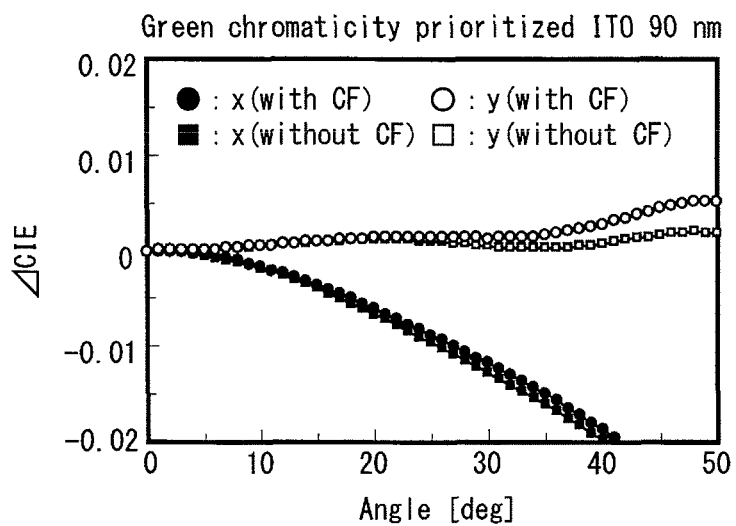
FIG. 11 shows the angular dependence of chromaticity when prioritizing chromaticity in the design of the green light-emitting element.
Figure 12:
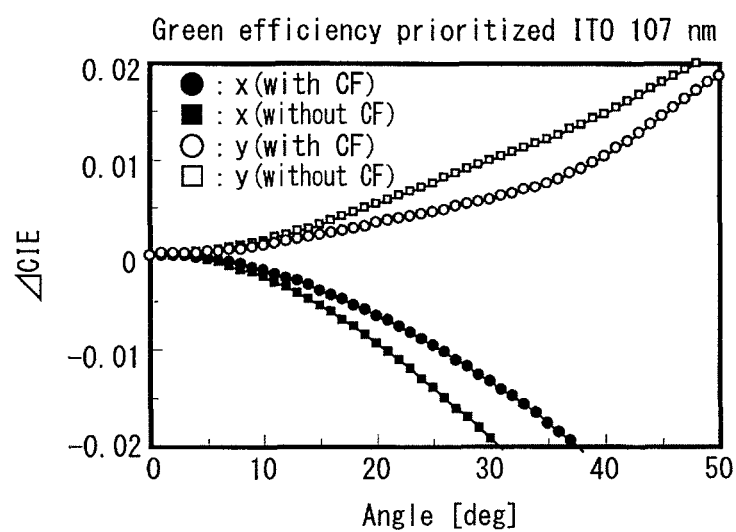
FIG. 12 shows the angular dependence of chromaticity when prioritizing efficiency in the design of the green light-emitting element.

FIG. 11 shows the angular dependence of chromaticity when prioritizing chromaticity in the design of the green light-emitting element. On the other hand, FIG. 12 shows the angular dependence of chromaticity when prioritizing efficiency in the design of the green light-emitting element. As shown in FIGS. 11 and 12, the angular dependence of chromaticity of the green light-emitting element as well is reduced by setting the film thickness d of the transparent conductive layer 4 to be 90 nm.

Figure 13A:
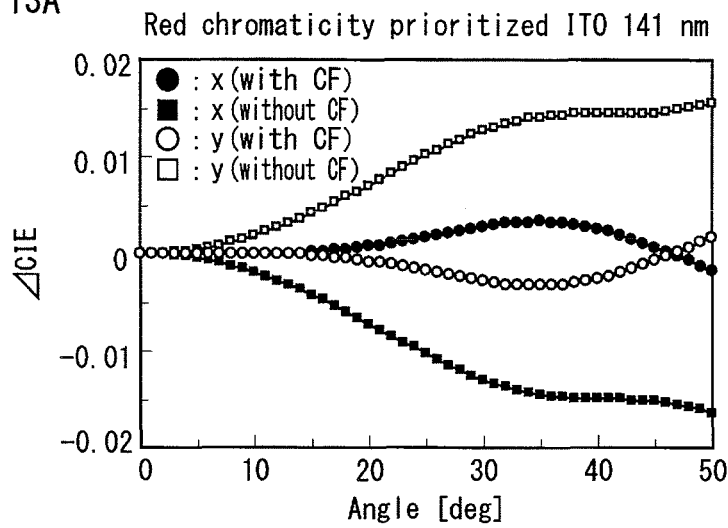
FIGS. 13A, 13B, and 13C show angular dependence of chromaticity when prioritizing chromaticity in the design of the red light-emitting element, with the film thickness of the transparent conductive layer being 141 nm in FIG. 13A, 144 nm in FIG. 13B, and 149 nm in FIG. 13C.
Figure 13B:
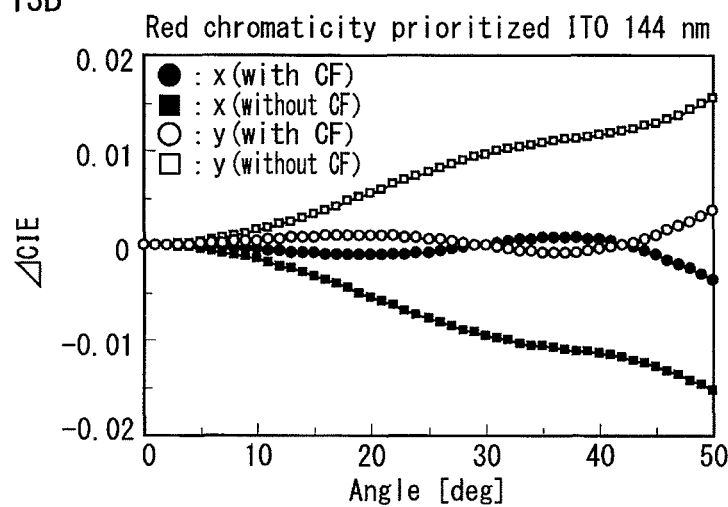
Figure 13C:
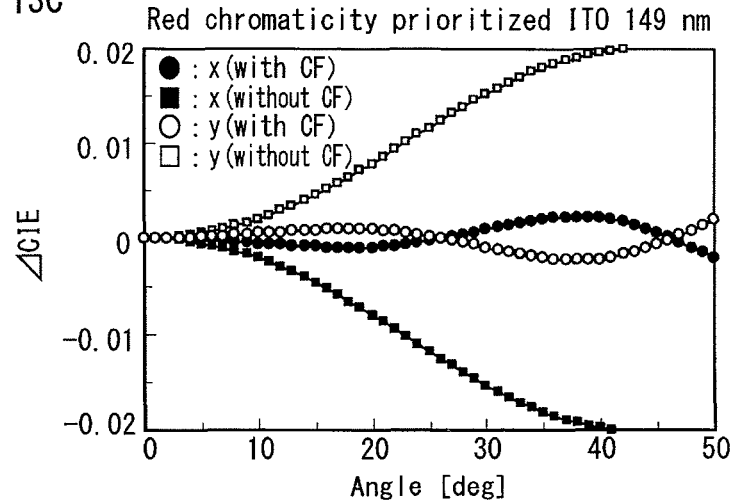
Figure 14A:
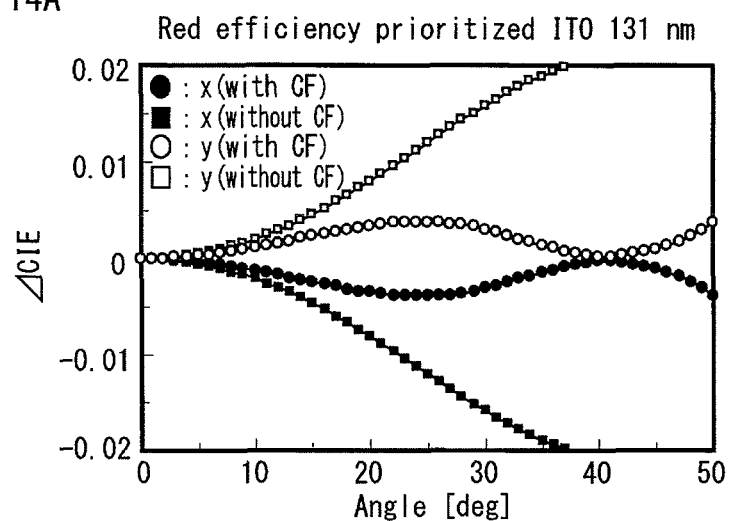
FIGS. 14A and 14B show angular dependence of chromaticity when prioritizing efficiency in the design of the red light-emitting element, with the film thickness of the transparent conductive layer being 131 nm in FIG. 14A and 136 nm in FIG. 14B.
Figure 14B:
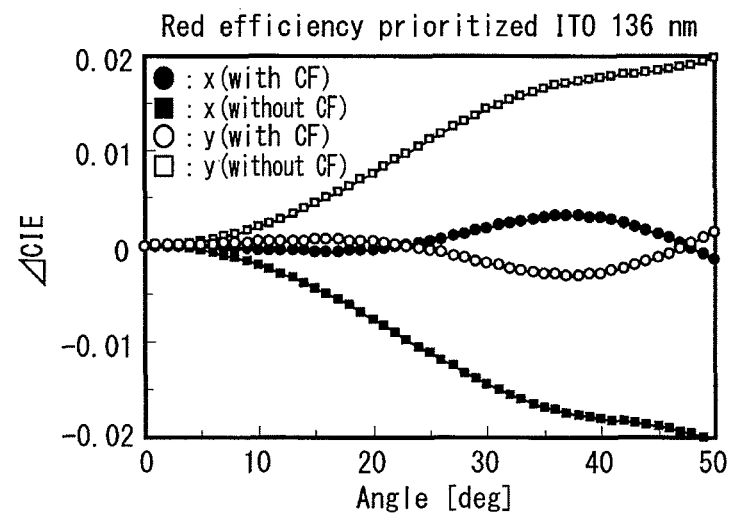

FIGS. 13A, 13B, and 13C show angular dependence of chromaticity when prioritizing chromaticity in the design of the red light-emitting element, with the film thickness of the transparent conductive layer being 141 nm in FIG. 13A, 144 nm in FIG. 13B, and 149 nm in FIG. 13C. On the other hand, FIGS. 14A and 14B show angular dependence of chromaticity when prioritizing efficiency in the design of the red light-emitting element, with the film thickness of the transparent conductive layer being 131 nm in FIG. 14A and 136 nm in FIG. 14B. As shown in FIGS. 13A-13C and 14A-14B, the angular dependence of chromaticity of the red light-emitting element as well is reduced by setting the film thickness d of the transparent conductive layer 4 to be from 141 nm to 149 nm inclusive, i.e. setting the total optical film thickness L to be from 384 nm to 400 nm inclusive. Note that when not providing a color filter, when the film thickness d of the transparent conductive layer 4 is 149 nm, the shift in chromaticity is comparatively large. Therefore, it is more preferable to set the film thickness d of the transparent conductive layer 4 to be from 141 nm to 144 nm inclusive, i.e. to set the total optical film thickness L to be from 384 nm to 390 nm inclusive.

As shown above, prioritizing chromaticity in the design allows for a greater reduction in the angular dependence of chromaticity as compared to when prioritizing efficiency in the design. Using light-emitting elements designed by thus prioritizing chromaticity achieves a display device with a wide viewing angle. Specific Examples of Each Layer <Substrate>

The substrate 1 is a Thin Film Transistor (TFT) substrate, for example. The substrate 1 is a glass plate or quartz plate of soda glass, nonfluorescent glass, phosphate glass, borate glass, or the like; a plastic plate or plastic film of acrylic resin, styrenic resin, polycarbonate resin, epoxy resin, polyethylene, polyester, silicone resin, or the like; or a metal plate or metal foil of alumina or the like.

<Banks>

The banks 2 should be formed from an insulating material, and it is preferable that the banks 2 have organic solvent resistance. Furthermore, since the banks 2 undergo etching, baking, and the like, it is preferable that the banks 2 be formed from a material that is highly resistant to such processes. The material for the banks 2 may be an organic material such as resin, or an inorganic material such as glass. As an organic material, acrylic resin, polyimide resin, novolac-type phenolic resin, and the like can be used, and as an inorganic material, silicon dioxide ($SiO_2$), silicon nitride ($Si_3N_4$), and the like can be used.

<Reflective Electrode>

The reflective electrode 3 is electrically connected to the TFT provided on the substrate 1. In addition to functioning as a positive terminal of the light-emitting element, the reflective electrode 3 has the function of reflecting light emitted from the light-emitting layers 7b, 7g, and 7r towards the reflective electrode 3. The reflecting function may be achieved by the structural material of the reflective electrode 3 or by applying a reflective coating to the surface portion of the reflective electrode 3. For example, the reflective electrode 3 is formed from Ag (silver), APC (alloy of silver, palladium, and copper), ARA (alloy of silver, rubidium, and gold), MoCr (alloy of molybdenum and chromium), NiCr (alloy of nickel and chromium), or the like.

<Transparent Conductive Layer>

In addition to being layered between the reflective electrode 3 and the hole injection layer 5 and forming a good bond therebetween, the transparent conductive layer 4 also functions as a protective layer to prevent the reflective electrode 3 from naturally oxidizing immediately after the reflective electrode 3 is formed in the manufacturing process. The material for the transparent conductive layer 4 should be formed from a conductive material sufficiently translucent with respect to light emitted by the light-emitting layers 7b, 7g, and 7r. For example, the transparent conductive layer 4 is preferably formed from ITO or Indium Zinc Oxide (IZO), which achieve good conductivity even when a film thereof is formed at room temperature.

<Hole Injection Layer>

The hole injection layer 5 has the function of injecting holes into the light-emitting layers 7b, 7g, and 7r. The hole injection layer 5 is formed from an oxide of a transition metal, such as tungsten oxide (WOx), molybdenum oxide (MoOx), molybdenum tungsten oxide (MoxWyOz), or the like. Forming the hole injection layer 5 from an oxide of a transition metal allows for improvement of voltage-current density characteristics, and for an increase in emission intensity by increasing current density. Other than the above materials, a conductive polymer material, such as conventionally-known PEDOT (a mixture of polythiophene and polystyrene sulfonate) or the like, may be used.

<Hole Transport Layer>

Examples of the material for the hole transport layer 6 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are preferable.

<Light-Emitting Layer>

The light-emitting layers 7b, 7g, and 7r are formed from a fluorescent material such as, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, and the like, as recited in Japanese Patent Application Publication No. H5-163488.

<Electron Transport Layer>

Examples of the material for the electron transport layer 8 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

<Transparent Electrode>

The transparent electrode 9 functions as a negative electrode for the light-emitting element. The material for the transparent electrode 9 should be formed from a conductive material sufficiently translucent with respect to light emitted by the light-emitting layers 7b, 7g, and 7r. For example, the transparent electrode 9 is preferably formed from ITO or IZO.

<Thin-Film Passivation Layer>

The thin-film passivation layer 10 has the function of preventing the layers interposed between the substrate 1 and the thin-film passivation layer 10 from being exposed to moisture or air. The material for the thin-film passivation layer 10 is, for example, silicon nitride (SiN), silicon oxynitride (SiON), resin, or the like.

<Resin Passivation Layer>

The resin passivation layer 11 has the functions of adhering the back panel, which is composed of the layers from the substrate 1 to the thin-film passivation layer 10, to the front panel, on which are formed the color filters 12b, 12g, and 12r, and of preventing the layers from being exposed to moisture or air. The material for the resin passivation layer 11 is, for example, a resin adhesive or the like.

<Color Filters>

The color filters 12b, 12g, and 12r have the function of correcting the chromaticity of light emitted by the light-emitting elements.

Display Device

Figure 15:
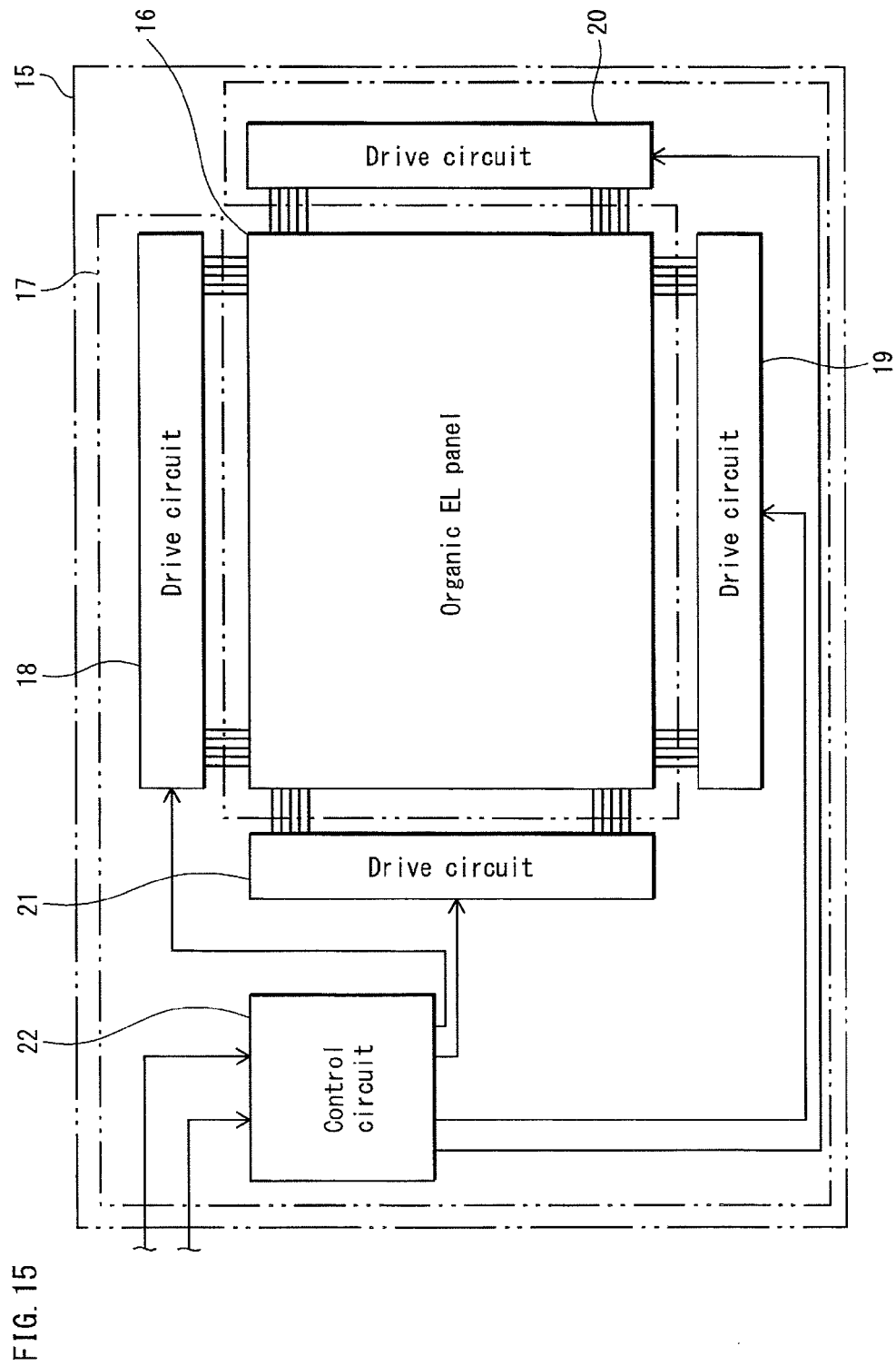
FIG. 15 shows a functional block for a display device according to an aspect of the present invention.
Figure 16:
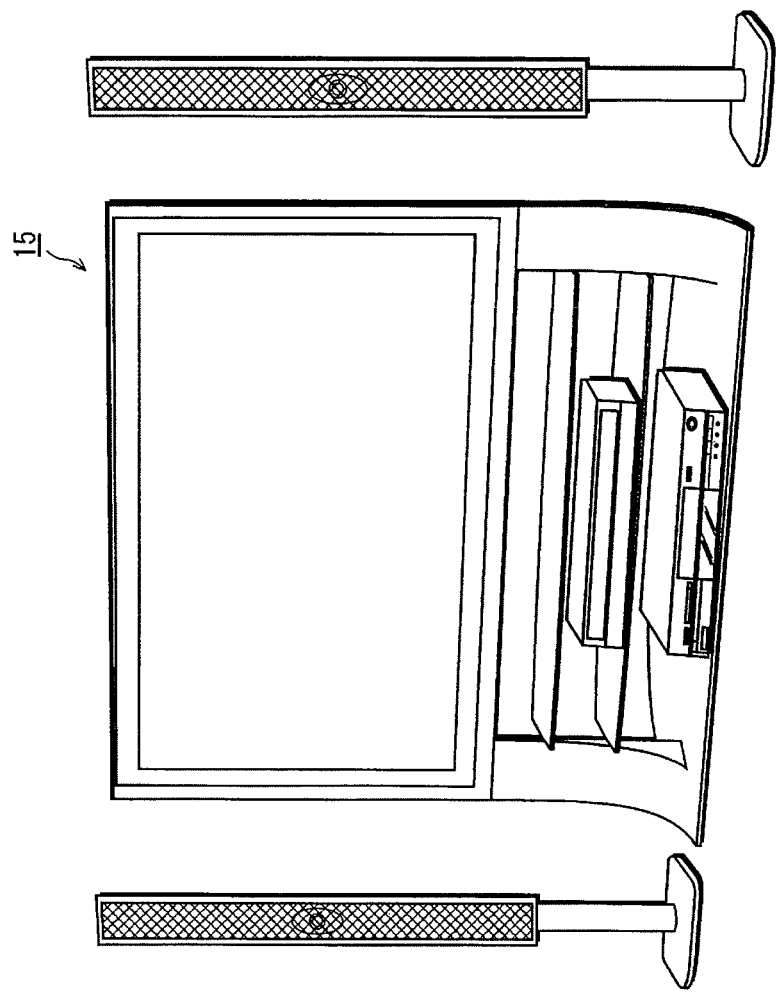
FIG. 16 shows an external view of a display device according to an aspect of the present invention.

FIG. 15 shows a functional block for a display device according to an aspect of the present invention. FIG. 16 shows an external view of a display device according to an aspect of the present invention. The display device 15 includes an organic EL panel 16 and a drive control unit 17 electrically connected thereto. The organic EL panel 16 has the pixel structure shown in FIG. 1. The drive control unit 17 includes drive circuits 18-21 that apply voltage between the reflective electrode of each light-emitting element and the transparent electrode, and a control circuit 22 that controls operations of the drive circuits 18-21.

Method of Manufacturing the Display Device

Next, the method of manufacturing the display device is described. FIGS. 17A-17D and 18A-18C illustrate the method of manufacturing a display device according to an aspect of the present invention.

Figure 17A:
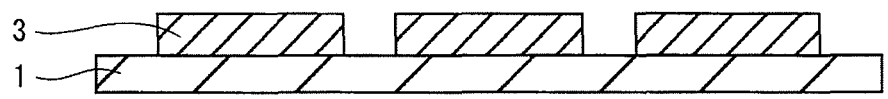
FIGS. 17A-17D illustrate a method of manufacturing a display device according to an aspect of the present invention.
Figure 17B:
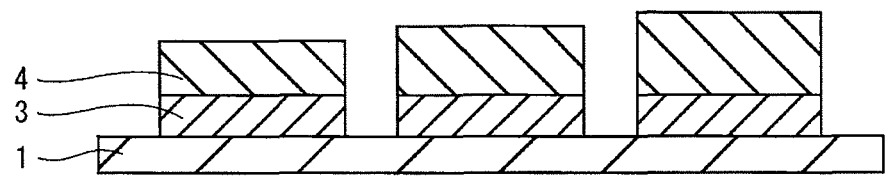

First, reflective electrodes 3 are formed on a substrate 1 by vapor deposition or sputtering (FIG. 17A). Next, transparent conductive layers 4 are formed on the reflective electrodes 3 by vapor deposition or sputtering (FIG. 17B). At this point, the film thickness of each transparent conductive layer 4 is made to differ as necessary for the colors R, G, and B.

Figure 17C:
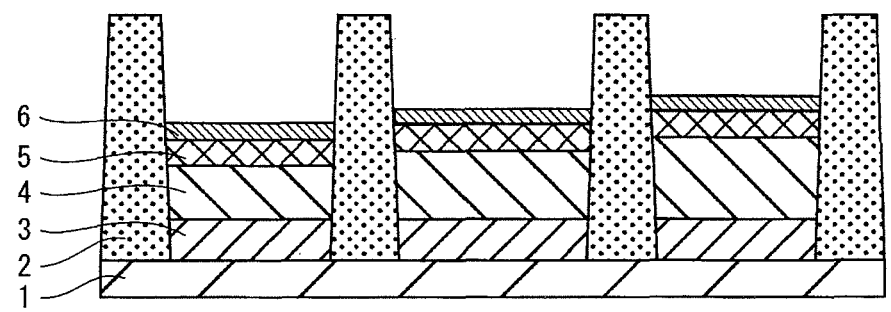

Next, on the transparent conductive layers 4, hole injection layers 5, for example, are formed by vapor deposition or sputtering, banks 2 are formed, and on the hole injection layers 5, hole transport layers 6, for example, are formed by a printing method such as the inkjet method (FIG. 17C). The film thickness of the hole injection layers 5 and of the hole transport layers 6 is the same for each of the colors R, G, and B.

Figure 17D:
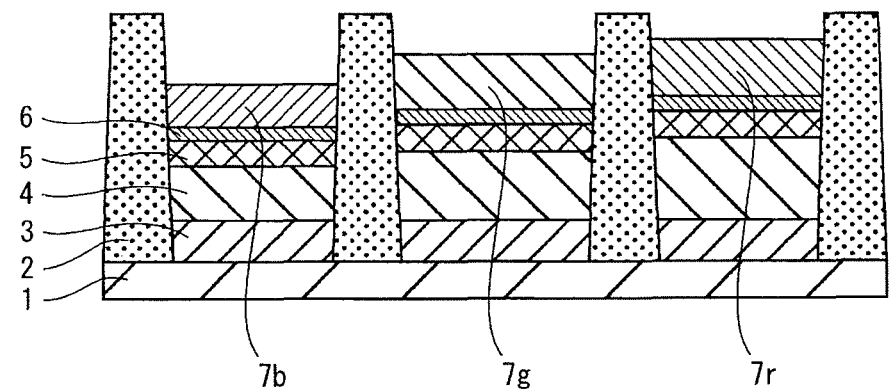

Next, on the hole transport layers 6, light-emitting layers 7b, 7g, and 7r, for example, are formed by a printing method such as the inkjet method (FIG. 17D). At this point, the film thickness of the organic light-emitting layers 7b, 7g, and 7r is made to differ as necessary for the colors R, G, and B.

Figure 18A:
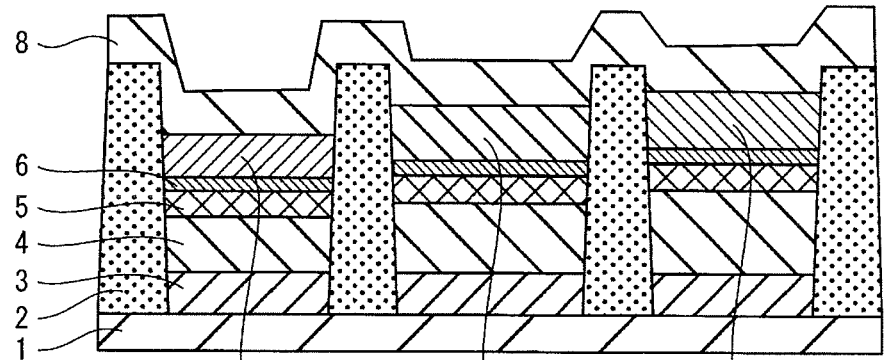
FIGS. 18A-18C illustrate a method of manufacturing a display device according to an aspect of the present invention.

Next, an electron transport layer 8 is formed on the light-emitting layers 7b, 7g, and 7r by vapor deposition or sputtering (FIG. 18A). The film thickness of the electron transport layer 8 is the same for each color, R, G, and B.

Figure 18B:
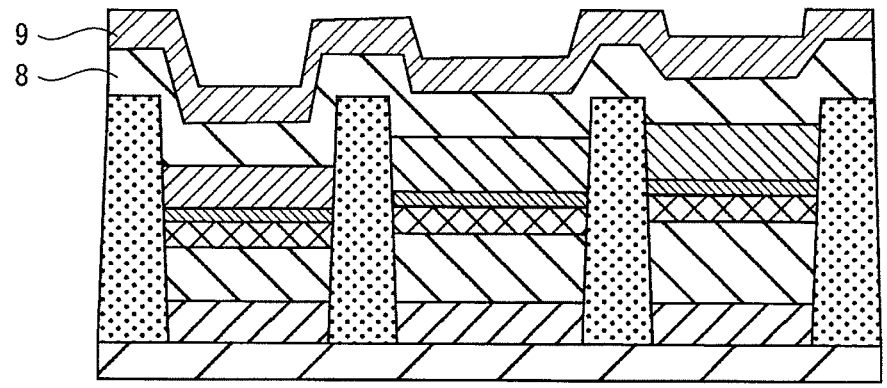

Next, a transparent electrode 9 is formed on the electron transport layer 8 by vapor deposition or sputtering (FIG. 18B). The film thickness of the transparent electrode 9 is, for example, from 90 nm to 110 nm inclusive.

Figure 18C:
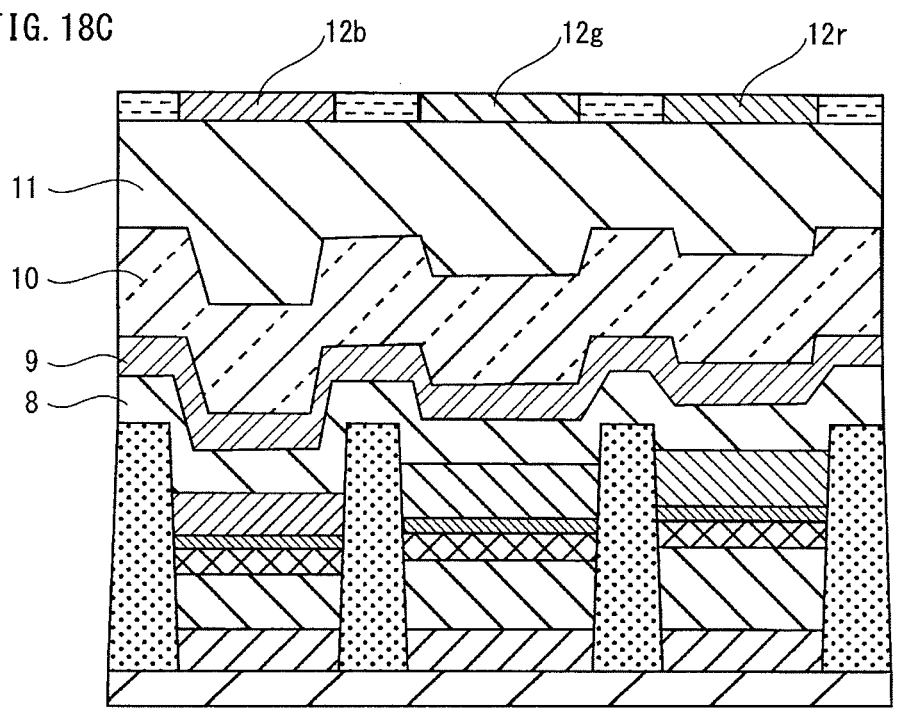

Next, a thin-film passivation layer 10 is formed on the transparent electrode 9 by vapor deposition or sputtering, and a substrate in which color filters 12b, 12g, and 12r are formed is adhered thereto using a resin passivation layer 11 (FIG. 18C). The film thickness of the passivation layers is, for example, from 900 nm to 1100 nm inclusive.

A display device can be manufactured by the above steps.

INDUSTRIAL APPLICABILITY

The present invention is applicable to organic EL displays, for example.

The invention claimed is:

1. A light-emitting element, comprising:
a reflective electrode that reflects incident light;
a transparent electrode that faces the reflective electrode and transmits an incident light therethrough;
a light-emitting layer, disposed between the reflective electrode and the transparent electrode, that emits a blue light;
a functional layer disposed between the reflective electrode and the light-emitting layer; and
a color filter disposed above the light-emitting layer, with the transparent electrode being interposed therebetween, wherein
a first portion of the blue light emitted from the light-emitting layer travels along a first optical path that passes through the functional layer, strikes the reflecting electrode and is reflected by the reflective electrode, and is then emitted externally after passing through the functional layer, the light-emitting layer, the transparent electrode, and the color filter,
a second portion of the blue light emitted from the light-emitting layer travels along a second optical path towards the transparent electrode, instead of towards the reflective electrode, and is emitted externally after passing through the transparent electrode and the color filter,
an optical film thickness of the functional layer is not close to an optical film thickness at which maximum light-extraction efficiency occurs when the color filter is not provided, and is close to an optical film thickness at which maximum light-extraction efficiency occurs when the color filter is provided, and
the optical film thickness of the functional layer is from approximately 218 nm to approximately 238 nm.

2. The light-emitting element of claim 1, wherein
a spectral intensity of light passing through the color filter is at a maximum value in a first wavelength range in which a spectral intensity of the blue light passing through the transparent electrode is at a maximum value, and in a second wavelength range that is longer than the first wavelength range and a third wavelength range that is shorter than the first wavelength range, the spectral intensity of light passing through the color filter being less than the maximum value in the first wavelength range, and with respect to the blue light passing through the transparent electrode, the color filter reduces a passage of light components that are in the second wavelength range, are unnecessary for achieving a target chromaticity, and have a spectral intensity less than the maximum value, the color filter allowing passage of the light components in the first wavelength range and in the third wavelength range.

3. A display device comprising an array of blue, green, and red light-emitting elements on a substrate, wherein
each of the blue light-emitting elements is the light-emitting element of claim 1.

4. The display device of claim 3, wherein
each red light emitting element of the red light-emitting elements has an optical film thickness of a functional layer of the red light emitting element that is from approximately 384 nm to approximately 400 nm.

5. The light emitting element of claim 1,
wherein the functional layer comprises plural layers.

6. A light-emitting element, comprising:
a reflective electrode that reflects incident light;
a transparent electrode that faces the reflective electrode and transmits an incident light therethrough;
a light-emitting layer, disposed between the reflective electrode and the transparent electrode, that emits a blue light;
a functional layer disposed between the reflective electrode and the light-emitting layer; and
a color filter disposed above the light-emitting layer, with the transparent electrode being interposed therebetween, wherein
a first portion of the blue light emitted from the light-emitting layer travels along a first optical path that passes through the functional layer, strikes the reflective electrode and is reflected by the reflective electrode, and is then emitted externally after passing through the functional layer, the light-emitting layer, the transparent electrode, and the color filter,
a second portion of the blue light emitted from the light-emitting layer travels along a second optical path towards the transparent electrode, instead of towards the reflective electrode, and is emitted externally after passing through the transparent electrode and the color filter,
an optical film thickness of the functional layer is not close to an optical film thickness at which maximum light-extraction efficiency occurs when the color filter is not provided, and is close to an optical film thickness at which maximum light-extraction efficiency occurs when the color filter is provided, and
the optical film thickness L (in nm) of the functional layer satisfies a following equation:

$$\frac{2L}{\lambda} + \frac{\Phi}{2\pi} = m$$

where $\lambda$ is a wavelength having a value from approximately 256 nm to approximately 280 nm, $\Phi$ is a phase shift at the reflective electrode, and m is an integer having a value of 1.

7. A display device comprising an array of blue, green, and red light-emitting elements on a substrate,
wherein each of the blue light-emitting elements is the light-emitting element of claim 6.

8. The display device of claim 7,
wherein each red light emitting element of the red light-emitting elements has an optical film thickness of a functional layer of the red light emitting element that is from approximately 384 nm to approximately 400 nm.

9. The light emitting element of claim 6,
wherein the functional layer comprises plural layers.

10. A light-emitting element, comprising:
a reflective electrode that reflects incident light;
a transparent electrode that faces the reflective electrode and transmits an incident light therethrough;
a light-emitting layer, disposed between the reflective electrode and the transparent electrode, that emits a red light;
a functional layer disposed between the reflective electrode and the light-emitting layer; and
a color filter disposed above the light-emitting layer, with the transparent electrode being interposed therebetween, wherein
a first portion of the red light emitted from the light-emitting layer travels along a first optical path that passes through the functional layer, strikes the reflective electrode and is reflected by the reflective electrode, and is then emitted externally after passing through the functional layer, the light-emitting layer, the transparent electrode, and the color filter,
a second portion of the red light emitted from the light-emitting layer travels along a second optical path towards the transparent electrode, instead of towards the reflective electrode, and is emitted externally after passing through the transparent electrode and the color filter,
an optical film thickness of the functional layer is not close to an optical film thickness at which maximum light-extraction efficiency occurs when the color filter is not provided, and is close to an optical film thickness at which maximum light-extraction efficiency occurs when the color filter is provided, and
the optical film thickness of the functional layer is from approximately 384 nm to approximately 400 nm.

11. The light emitting element of claim 10,
wherein the functional layer comprises plural layers.

12. A light-emitting element, comprising:
a reflective electrode that reflects incident light;
a transparent electrode that faces the reflective electrode and transmits an incident light therethrough;
a light-emitting layer, disposed between the reflective electrode and the transparent electrode, that emits a red light;
a functional layer disposed between the reflective electrode and the light-emitting; and
a color filter disposed above the light-emitting layer, with the transparent electrode being interposed therebetween, wherein
a first portion of the red light emitted from the light-emitting layer travels along a first optical path that passes through the functional layer, strikes the reflective electrode and is reflected by the reflective electrode, and is then emitted externally after passing through the functional layer, the light-emitting layer, the transparent electrode, and the color filter,
a second portion of the red light emitted from the light-emitting layer travels along a second optical path towards the transparent electrode, instead of towards the reflective electrode, and is emitted externally after passing through the transparent electrode and the color filter, an optical film thickness of the functional layer is not close to an optical film thickness at which maximum light-extraction efficiency occurs when the color filter is not provided, and is close to an optical film thickness at which maximum light-extraction efficiency occurs when the color filter is provided, and the optical film thickness L (in nm) of the functional layer satisfies a following equation:

$$\frac{2L}{\lambda} + \frac{\Phi}{2\pi} = m$$

where $\lambda$ is a wavelength having a value from approximately 452 nm to approximately 470 nm, $\Phi$ is a phase shift at the reflective electrode, and m is an integer having a value of 1.

13. The light emitting element of claim 12, wherein the functional layer comprises plural layers.

* * * * *